United States Patent
Nirmal et al.

(10) Patent No.: US 6,667,143 B2
(45) Date of Patent: Dec. 23, 2003

(54) ELECTRONICALLY ACTIVE PRIMER LAYERS FOR THERMAL PATTERNING OF MATERIALS FOR ELECTRONIC DEVICES

(75) Inventors: Manoj Nirmal, St. Paul, MN (US); Ha T. Le, St. Paul, MN (US); Martin B. Wolk, Woodbury, MN (US); Erika Bellmann, St. Paul, MN (US); Fred McCormick, Maplewood, MN (US)

(73) Assignee: 3M Innovative Properties Company, St. Paul, MN (US)

(*) Notice: Subject to any disclaimer, the term of this patent is extended or adjusted under 35 U.S.C. 154(b) by 0 days.

(21) Appl. No.: 10/265,934

(22) Filed: Oct. 8, 2002

(65) Prior Publication Data

US 2003/0049560 A1 Mar. 13, 2003

Related U.S. Application Data

(62) Division of application No. 10/044,634, filed on Jan. 11, 2002, now Pat. No. 6,482,564, which is a continuation of application No. 09/662,845, filed on Sep. 15, 2000, now Pat. No. 6,358,664.

(51) Int. Cl.$^7$ .............................. G03F 7/34; G03F 7/00
(52) U.S. Cl. ................... 430/200; 430/201; 430/273.1; 430/319; 156/234
(58) Field of Search ................ 430/200, 201, 430/273.1, 319; 156/234

(56) References Cited

U.S. PATENT DOCUMENTS

| | | |
|---|---|---|
| 4,252,671 A | 2/1981 | Smith |
| 5,061,569 A | 10/1991 | VanSlyke et al. |
| 5,166,024 A | 11/1992 | Bugner et al. |
| 5,256,506 A | 10/1993 | Ellis et al. |
| 5,351,617 A | 10/1994 | Williams et al. |
| 5,521,035 A | 5/1996 | Wolk et al. |
| 5,685,939 A | 11/1997 | Wolk et al. |
| 5,688,551 A | 11/1997 | Littman et al. |
| 5,691,098 A | 11/1997 | Busman et al. |
| 5,693,446 A | 12/1997 | Staral et al. ............... 430/200 |
| 5,707,745 A | 1/1998 | Forrest et al. |
| 5,710,097 A | 1/1998 | Staral et al. ............... 430/200 |
| 5,725,989 A | 3/1998 | Chang et al. |
| 5,777,070 A | 7/1998 | Inbasekaran et al. |
| 5,904,961 A | 5/1999 | Tang et al. |
| 5,937,272 A | 8/1999 | Tang et al. |
| 5,998,085 A | 12/1999 | Isberg et al. ............... 430/200 |
| 6,114,088 A | 9/2000 | Wolk et al. ................. 430/200 |
| 6,221,553 B1 | 4/2001 | Wolk et al. ................. 430/200 |
| 6,358,664 B1 | 3/2002 | Nirmal et al. .............. 430/200 |
| 6,482,564 B2 | 11/2002 | Nirmal et al. .............. 430/200 |

FOREIGN PATENT DOCUMENTS

| | | |
|---|---|---|
| EP | 851 714 A2 | 1/1998 |
| WO | WO 92/06410 | 4/1992 |
| WO | WO 97/15173 | 4/1997 |
| WO | WO 98/03346 * | 1/1998 |
| WO | WO 99/46961 | 9/1999 |
| WO | WO 00/14777 | 3/2000 |
| WO | WO 00/41892 | 7/2000 |
| WO | WO 00/41893 | 7/2000 |
| WO | WO 00/41894 | 7/2000 |
| WO | WO 00/46321 | 8/2000 |

OTHER PUBLICATIONS

Chen, et al., *Macromol. Symp.*, 125, "Recent Developments in Molecular Organic Electroluminescent Materials" (1997) pp. 1–48.

(List continued on next page.)

*Primary Examiner*—Richard L. Schilling (57) ABSTRACT

The present invention provides an active primer that includes an electronically active material dispersed in a binder. The active primer can be disposed between a thermal transfer donor sheet and a receptor to assist selective thermal transfer of a material from the donor sheet to the receptor to form at least a portion of an electronic device on the receptor. The binder of the active primer can be selected to improve adhesion of the transferred material to the receptor, or to enhance other transfer properties. The electronically active material of the active primer can be selected to maintain a desired level of functionality in the electronic device being patterned on the receptor.

10 Claims, 1 Drawing Sheet

OTHER PUBLICATIONS

Elschner, et al., *Synthetic Metals,* 111–112, "PEDT/PSS for efficient hole–injection in hybrid organic light–emitting diodes" (2000) pp. 139–143.

Halls et al., *Thin Solid Films,* 276, "Light–emitting and photoconductive diodes fabricated with conjugated polymers" (1996) pp. 13–20.

Kido, *Trends in Polymer Science,* 2, "Organic Electroluminescent Devices Based on Polymeric Materials", (1994) pp. 350–355.

Kraft et al., *Angew. Chem. Int. Ed.,* 37, "Electroluminescent Conjugated Polymers–Seeing Polymers in a New Light" (1998) pp. 402–428.

Pei et al., *J. Amer. Chem. Soc.,* 118, "Polymer Light–Emitting Electrochemical Cells: In Situ Formation of a Light-Emitting p–n Junction" (1996) pp. 3922–3929.

Segura, *Acta Polym.,* 49, "The chemistry of electroluminescent organic materials" (1998) pp. 319–344.

Shen et al., *Science,* 276, "Three–Color, Tunable, Organic Light–Emitting Devices" (1997) pp. 2009–2011.

Tsutsui, *MRS Bulletin,* 22, "Progress in Electroluminescent Devices Using Molecular Thin Films" (1997) pp. 39–45.

* cited by examiner

ELECTRONICALLY ACTIVE PRIMER LAYERS FOR THERMAL PATTERNING OF MATERIALS FOR ELECTRONIC DEVICES

This is a divisional application of U.S. patent application Ser. No. 10/044,634, filed Jan. 11, 2002, now U.S. Pat. No. 6,482,564 which is a continuation of U.S. patent application Ser. No. 09/662,845, filed Sep. 15, 2000, now U.S. Pat. No. 6,358,664, all of which are incorporated herein by reference.

This invention relates to thermal transfer of emissive materials from donor sheets to receptor substrates.

BACKGROUND

Pattern-wise thermal transfer of materials from donor sheets to receptor substrates has been proposed for a wide variety of applications. For example, materials can be selectively thermally transferred to form elements useful in electronic displays and other devices. Specifically, selective thermal transfer of color filters, black matrix, spacers, polarizers, conductive layers, transistors, phosphors, and organic electroluminescent materials have all been proposed.

SUMMARY OF THE INVENTION

Thermal transfer of some materials can be problematic, especially for high resolution applications and for transfer processes where adhesion of the transferred materials to the receptor upon transfer (or other such transfer-related properties) is an issue. To address these issues, adhesive layers, or other so-called transfer assist layers, can be deposited on receptors or on transfer layers prior to thermal transfer. However, when transferring a material or materials to make an electronically active device such as a transistor or an organic electroluminescent device, the adhesive or transfer assist layer will often be disposed between layers of the finished device. In such a case, it may be important to provide a transfer assist layer that also provides functionality, or in any case does not undesirably hinder device operability. The present invention provides an active primer layer that can both improve transfer properties and maintain device functionality. Furthermore, the present invention contemplates an active primer that includes an electronically active material dispersed in a binder where the electronically active material can be selected for functionality (e.g., given the specific device being made, construction of the device, materials of the device, and so on) and the binder can be selected for transfer assist properties (e.g., given the materials being transferred, details of the receptor substrate, and so on). The present invention also contemplates active primers that include polymers having active materials pendant to polymer backbone, that is polymers functionalized by covalent bonding of active materials. For the purposes of describing the present invention, the phrase "active material dispersed in a binder" and other such descriptions of the active primer expressly include polymers functionalized with active materials.

By way of example, active primer layers of the present invention can be useful in improving the transfer of light emitting polymers to form organic electroluminescent devices where the active material of the primer layer provides a charge transport function.

In one embodiment, the present invention provides a process for patterning a layer of an electronic device including the steps of disposing an active primer between a receptor substrate and a thermal transfer donor and selectively thermally transferring a portion of a transfer layer that includes a material component of the electronic device from the donor to the receptor to form at least a portion of the electronic device. The active primer includes an electronically active material dispersed in a binder, the binder being selected to promote selective thermal transfer of the transfer layer to the receptor, and the electronically active material being selected to maintain operability of the electronic device.

In another embodiment, the present invention provides a process for patterning a plurality of organic electroluminescent devices on a receptor. In the process, a receptor is provided that includes a plurality of anodes disposed on a surface thereof, and a thermal transfer donor element is provided that includes a base substrate and a transfer layer. The transfer layer includes an organic electroluminescent material. Next, an active primer is disposed between the anode surface of the receptor substrate and the transfer layer of the donor element. The active primer includes an electronically active material dispersed in a binder, the binder selected to promote thermal transfer of the transfer layer to the receptor. Next, the transfer layer is selectively thermally transferred from the donor element to the receptor to form a pattern of the organic electroluminescent material on the receptor. Next, a cathode material is deposited on the pattern of the organic electroluminescent material to form a plurality of organic electroluminescent devices on the receptor, each of the devices including in the following order one of the anodes, a portion of the active primer, a portion of the organic electroluminescent material, and a portion of the cathode.

In yet another embodiment, the present invention provides a thermal transfer donor element that includes a base substrate, a thermal transfer layer capable of being selectively thermally transferred from the donor element to form at least a portion of an electronic device, and an active primer disposed on the thermal transfer layer as the outermost layer of the donor element. The active primer includes an electronically active material dispersed in a binder, the binder being selected to promote selective thermal transfer of the transfer layer to a receptor, and the electronically active material being selected to maintain operability of the electronic device.

BRIEF DESCRIPTION OF THE DRAWINGS

The invention may be more completely understood in consideration of the following detailed description of various embodiments of the invention in connection with the accompanying drawings, in which.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

The present invention is believed to be applicable to thermal mass transfer of materials from a donor element to a receptor to form electronic devices or portions thereof. In particular, the present invention is directed to thermal mass transfer of materials to form organic electroluminescent devices (OLEDs) or portions thereof, and particularly to thermal transfer of organic electroluminescent materials. The present invention provides a primer layer between the thermal transfer donor element and the receptor substrate, for example to facilitate transfer and maintain device functionality. Because the present invention contemplates patterning of electronic devices by thermal transfer, the active primer layer can be selected to improve transfer properties and to maintain, or add, functionality. According to the present invention, active primer layers disposed between donors and receptors can include an active material dispersed in a binder, where the binder can be selected to promote adhesion of transferred material(s) to the receptor (or to otherwise improve transfer properties) and the active material can be selected to provide functionality. For example, the active material can be selected so that the primer layer performs a charge transport or charge injection function in an OLED, and the binder material can be selected to improve transfer fidelity of an organic electroluminescent material from a donor sheet to the receptor. Transfer fidelity refers to the degree to which the pattern of material actually transferred from donor media to a receptor matches the intended transfer pattern.

Active primers of the present invention can also allow independent selection of compatible binders (or polymers) and active materials. The ability to independently select compatible binders and active materials can allow flexibility in designing primer layers to enable higher fidelity patterning of a wider range of materials for electronic devices. This can be particularly useful when thermally transferring light emitting polymers or other materials that provide functionality in a device. In some instances, it may be difficult to thermally transfer such materials due to their physical and mechanical properties (such as high molecular weight, rigidity, high intra-film cohesive properties, and the like). Because such materials provide functionality, it might not always be desirable to modify them from their pure form in order to improve their transferability in thermal patterning operations, although such modifications have been successful, as disclosed in co-assigned U.S. patent application Ser. No. 09/662,980. The present invention provides an active primer that can be chosen for its transfer assist properties with particular transfer material(s) in mind while maintaining desired device functionality.

Figure 1:
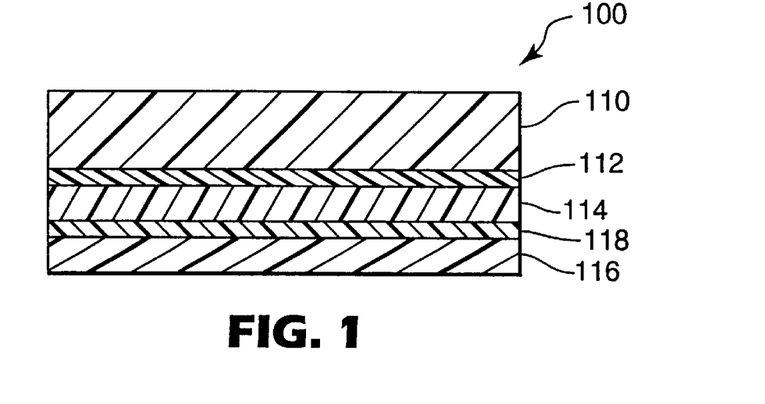
FIG. 1 is a schematic cross section of a donor sheet.

FIG. 1 shows an example of a thermal transfer donor 100 that includes a base substrate 110, an optional underlayer 112, a light-to-heat conversion layer (LTHC layer) 114, an optional interlayer 118, and a transfer layer 116. Other layers can also be present. Some exemplary donors are disclosed in U.S. Pat. Nos. 6,114,088; 5,998,085; and 5,725,989, in International Publication No. 00/41893, and in co-assigned U.S. patent application Ser. Nos. 09/473,114 and 09/474,002.

Materials can be transferred from the transfer layer of a thermal mass transfer donor element to a receptor substrate by placing the transfer layer of the donor element adjacent to the receptor and irradiating the donor element with imaging radiation that can be absorbed by the LTHC layer and converted into heat. The donor can be exposed to imaging radiation through the donor substrate, or through the receptor, or both. The radiation can include one or more wavelengths, including visible light, infrared radiation, or ultraviolet radiation, for example from a laser, lamp, or other such radiation source. Material from the thermal transfer layer can be selectively transferred to a receptor in this manner to imagewise form patterns of the transferred material on the receptor. In many instances, thermal transfer using light from, for example, a lamp or laser, is advantageous because of the accuracy and precision that can often be achieved. The size and shape of the transferred pattern (e.g., a line, circle, square, or other shape) can be controlled by, for example, selecting the size of the light beam, the exposure pattern of the light beam, the duration of directed beam contact with the thermal mass transfer element, and/or the materials of the thermal mass transfer element. The transferred pattern can also be controlled by irradiating the donor element through a mask.

Alternatively, a thermal print head or other heating element (patterned or otherwise) can be used to selectively heat the donor element directly, thereby pattern-wise transferring portions of the transfer layer. In such a case, the LTHC layer in the donor sheet is optional. Thermal print heads or other heating elements may be particularly suited for patterning devices for low resolution segmented displays, emissive icons, and the like.

The mode of thermal mass transfer can vary depending on the type of irradiation, the type of materials and properties of the LTHC layer, the type of materials in the transfer layer, etc., and generally occurs via one or more mechanisms, one or more of which may be emphasized or de-emphasized during transfer depending on imaging conditions, donor constructions, and so forth. One mechanism of thermal transfer includes thermal melt-stick transfer whereby localized heating at the interface between the thermal transfer layer and the rest of the donor element can lower the adhesion of the thermal transfer layer to the donor in selected locations. Selected portions of the thermal transfer layer can adhere to the receptor more strongly than to the donor so that when the donor element is removed, the selected portions of the transfer layer remain on the receptor. Another mechanism of thermal transfer includes ablative transfer whereby localized heating can be used to ablate portions of the transfer layer off of the donor element, thereby directing ablated material toward the receptor. Yet another mechanism of thermal transfer includes sublimation whereby material dispersed in the transfer layer can be sublimated by heat generated in the donor element. A portion of the sublimated material can condense on the receptor. The present invention contemplates transfer modes that include one or more of these and other mechanisms whereby the heat generated in an LTHC layer of a thermal mass transfer donor element can be used to cause the transfer of materials from a transfer layer to receptor surface.

A variety of radiation-emitting sources can be used to heat thermal mass transfer donor elements. For analog techniques (e.g., exposure through a mask), high-powered light sources (e.g., xenon flash lamps and lasers) are useful. For digital imaging techniques, infrared, visible, and ultraviolet lasers are particularly useful. Suitable lasers include, for example, high power ($\geqq 100$ mW) single mode laser diodes, fiber-coupled laser diodes, and diode-pumped solid state lasers (e.g., Nd:YAG and Nd:YLF). Laser exposure dwell times can vary widely from, for example, a few hundredths of microseconds to tens of microseconds or more, and laser fluences can be in the range from, for example, about 0.01 to about 5 $J/cm^2$ or more. Other radiation sources and irradiation conditions can be suitable based on, among other things, the donor element construction, the transfer layer material, the mode of thermal mass transfer, and other such factors.

When high spot placement accuracy is required (e.g., for high information full color display applications) over large substrate areas, a laser is particularly useful as the radiation source. Laser sources are also compatible with both large rigid substrates (e.g., 1 m×1 m×1.1 mm glass) and continuous or sheeted film substrates (e.g., 100 μm thick polyimide sheets).

During imaging, the thermal mass transfer element can be brought into intimate contact with a receptor (as might typically be the case for thermal melt-stick transfer mechanisms) or the thermal mass transfer element can be spaced some distance from the receptor (as can be the case for ablative transfer mechanisms or transfer material sublimation mechanisms). In at least some instances, pressure or vacuum can be used to hold the thermal transfer element in intimate contact with the receptor. In some instances, a mask can be placed between the thermal transfer element and the receptor. Such a mask can be removable or can remain on the receptor after transfer. A radiation source can then be used to heat the LTHC layer (and/or other layer(s) containing radiation absorber) in an imagewise fashion (e.g., digitally or by analog exposure through a mask) to perform imagewise transfer and/or patterning of the transfer layer from the thermal transfer element to the receptor.

Typically, selected portions of the transfer layer are transferred to the receptor without transferring significant portions of the other layers of the thermal mass transfer element, such as the optional interlayer or the LTHC layer. The presence of the optional interlayer may eliminate or reduce the transfer of material from the LTHC layer to the receptor and/or reduce distortion in the transferred portion of the transfer layer. Preferably, under imaging conditions, the adhesion of the optional interlayer to the LTHC layer is greater than the adhesion of the interlayer to the transfer layer. In some instances, a reflective interlayer can be used to attenuate the level of imaging radiation transmitted through the interlayer and reduce any damage to the transferred portion of the transfer layer that may result from interaction of the transmitted radiation with the transfer layer and/or the receptor. This is particularly beneficial in reducing thermal damage which may occur when the receptor is highly absorptive of the imaging radiation.

Large thermal transfer elements can be used, including thermal transfer elements that have length and width dimensions of a meter or more. In operation, a laser can be rastered or otherwise moved across the large thermal transfer element, the laser being selectively operated to illuminate portions of the thermal transfer element according to a desired pattern. Alternatively, the laser may be stationary and the thermal transfer element and/or receptor substrate moved beneath the laser.

In some instances, it may be necessary, desirable, and/or convenient to sequentially use two or more different thermal transfer elements to form electronic devices on a receptor. For example, multiple layer devices can be formed by transferring separate layers or separate stacks of layers from different thermal transfer elements. Multilayer stacks can also be transferred as a single transfer unit from a single donor element. Examples of multilayer devices include transistors such as organic field effect transistors (OFETs), organic electroluminescent pixels and/or devices, including OLEDs. Multiple donor sheets can also be used to form separate components in the same layer on the receptor. For example, three different donors that each have a transfer layer comprising an organic electroluminescent material that emits a different color (for example, red, green, and blue) can be used to form RGB sub-pixel OLED elements for a color electronic display. Also, separate donor sheets, each having multiple layer transfer layers, can be used to pattern different multilayer devices (e.g., OLEDs that emit different colors, OLEDs and OFETs that connect to form addressable pixels, etc.). Typically, materials from separate donor sheets are transferred adjacent to other materials on a receptor for form adjacent devices, portions of adjacent devices, or different portions of the same device. Alternatively, materials from separate donor sheets can be transferred directly on top of, or in partial overlying registration with, other layers or materials previously patterned onto the receptor either by thermal transfer or some other transfer method. A variety of other combinations of two or more thermal transfer elements can be used to form a device, each thermal transfer element forming one or more portions of the device. It will be understood other portions of these devices, or other devices on the receptor, may be formed in whole or in part by any suitable process including photolithographic processes, ink jet processes, and various other printing or mask-based processes.

Referring back to FIG. 1, various layers of the thermal mass transfer donor element 100 will now be described.

The donor substrate 110 can be a polymer film. One suitable type of polymer film is a polyester film, for example, polyethylene terephthalate or polyethylene naphthalate films. However, other films with sufficient optical properties, including high transmission of light at a particular wavelength, as well as sufficient mechanical and thermal stability for the particular application, can be used. The donor substrate, in at least some instances, is flat so that uniform coatings can be formed. The donor substrate is also typically selected from materials that remain stable despite heating of the LTHC layer. However, as described below, the inclusion of an underlayer between the substrate and the LTHC layer can be used to insulate the substrate from heat generated in the LTHC layer during imaging. The typical thickness of the donor substrate ranges from 0.025 to 0.15 mm, preferably 0.05 to 0.1 mm, although thicker or thinner donor substrates may be used.

The materials used to form the donor substrate and an adjacent underlayer can be selected to improve adhesion between the donor substrate and the underlayer, to control heat transport between the substrate and the underlayer, to control imaging radiation transport to the LTHC layer, to reduce imaging defects and the like. An optional priming layer can be used to increase uniformity during the coating of subsequent layers onto the substrate and also increase the bonding strength between the donor substrate and adjacent layers. One example of a suitable substrate with primer layer is available from Teijin Ltd. (Product No. HPE100, Osaka, Japan).

An optional underlayer 112 may be coated or otherwise disposed between a donor substrate and the LTHC layer, for example to control heat flow between the substrate and the LTHC layer during imaging and/or to provide mechanical stability to the donor element for storage, handling, donor processing, and/or imaging. Examples of suitable underlayers and methods of providing underlayers are disclosed in co-assigned U.S. patent application Ser. No. 09/473,114.

The underlayer can include materials that impart desired mechanical and/or thermal properties to the donor element. For example, the underlayer can include materials that exhibit a low (specific heat×density) and/or low thermal conductivity relative to the donor substrate. Such an underlayer may be used to increase heat flow to the transfer layer, for example to improve the imaging sensitivity of the donor.

The underlayer may also include materials for their mechanical properties or for adhesion between the substrate and the LTHC. Using an underlayer that improves adhesion between the substrate and the LTHC layer may result in less distortion in the transferred image. As an example, in some cases an underlayer can be used that reduces or eliminates delamination or separation of the LTHC layer, for example, that might otherwise occur during imaging of the donor media. This can reduce the amount of physical distortion exhibited by transferred portions of the transfer layer. In other cases, however it may be desirable to employ underlayers that promote at least some degree of separation between or among layers during imaging, for example to produce an air gap between layers during imaging that can provide a thermal insulating function. Separation during imaging may also provide a channel for the release of gases that may be generated by heating of the LTHC layer during imaging. Providing such a channel may lead to fewer imaging defects.

The underlayer may be substantially transparent at the imaging wavelength, or may also be at least partially absorptive or reflective of imaging radiation. Attenuation and/or reflection of imaging radiation by the underlayer may be used to control heat generation during imaging.

The underlayer can be comprised of any of a number of known polymers such as thermoset (crosslinked), thermosettable (crosslinkable), or thermoplastic polymers, including acrylates (including methacrylates, blends, mixtures, copolymers, terpolymers, tetrapolymers, oligomers, macromers, etc.), polyols (including polyvinyl alcohols), epoxy resins (also including copolymers, blends, mixtures, terpolymers, tetrapolymers, oligomers, macromers, etc.), silanes, siloxanes (with all types of variants thereof), polyvinyl pyrrolidinones, polyesters, polyimides, polyamides, poly (phenylene sulphide), polysulphones, phenol-formaldehyde resins, cellulose ethers and esters (for example, cellulose acetate, cellulose acetate butyrate, etc.), nitrocelluloses, polyurethane, polyesters (for example, poly (ethylene terephthalate), polycarbonates, polyolefin polymers (for example, polyethylene, polypropylene, polychloroprene, polyisobutylene, polytetrafluoroethylene, polychlorotrifluoroethylene, poly (p-chlorostyrene), polyvinylidene fluoride, polyvinylchloride, polystyrene, etc.) and copolymers (for example, polyisobutene-co-isoprene, etc.), polymerizable compositions comprising mixtures of these polymerizable active groups (e.g., epoxy-siloxanes, epoxy-silanes, acryloyl-silanes, acryloyl-siloxanes, acryloyl-epoxies, etc.), phenolic resins (e.g., novolak and resole resins), polyvinylacetates, polyvinylidene chlorides, polyacrylates, nitrocelluloses, polycarbonates, and mixtures thereof. The underlayers may include homopolymers or copolymers (including, but not limited to random copolymers, graft copolymers, block copolymers, etc.).

Underlayers may be formed by any suitable means, including coating, laminating, extruding, vacuum or vapor depositing, electroplating, and the like. For example, crosslinked underlayers may be formed by coating an uncrosslinked material onto a donor substrate and crosslinking the coating. Alternatively a crosslinked underlayer may be initially formed and then laminated to the substrate subsequent to crosslinking. Crosslinking can take place by any means known in the art, including exposure to radiation and/or thermal energy and/or chemical curatives (water, oxygen, etc.).

The thickness of the underlayer is typically greater than that of conventional adhesion primers and release layer coatings, preferably greater than 0.1 microns, more preferably greater than 0.5 microns, most preferably greater than 1 micron. In some cases, particularly for inorganic or metallic underlayers, the underlayer can be much thinner. For example, thin metal underlayers that are at least partially reflective at the imaging wavelength might be useful in imaging systems where the donor elements are irradiated from the transfer layer side. In other cases, the underlayers can be much thicker than these ranges, for example when the underlayer is included to provide some mechanical support in the donor element.

Referring again to FIG. 1, an LTHC layer 114 can be included in thermal mass transfer elements of the present invention to couple irradiation energy into the thermal transfer element. The LTHC layer preferably includes a radiation absorber that absorbs incident radiation (e.g., laser light) and converts at least a portion of the incident radiation into heat to enable transfer of the transfer layer from the thermal transfer element to the receptor.

Generally, the radiation absorber(s) in the LTHC layer absorb light in the infrared, visible, and/or ultraviolet regions of the electromagnetic spectrum and convert the absorbed radiation into heat. The radiation absorber materials are typically highly absorptive of the selected imaging radiation, providing an LTHC layer with an optical density at the wavelength of the imaging radiation in the range of about 0.2 to 3 or higher. Optical density is the absolute value of the logarithm (base 10) of the ratio of the intensity of light transmitted through the layer to the intensity of light incident on the layer.

Radiation absorber material can be uniformly disposed throughout the LTHC layer or can be non-homogeneously distributed. For example, as described in co-assigned U.S. patent application Ser. No. 09/474,002, non-homogeneous LTHC layers can be used to control temperature profiles in donor elements. This can give rise to thermal transfer elements that have improved transfer properties (e.g., better fidelity between the intended transfer patterns and actual transfer patterns).

Suitable radiation absorbing materials can include, for example, dyes (e.g., visible dyes, ultraviolet dyes, infrared dyes, fluorescent dyes, and radiation-polarizing dyes), pigments, metals, metal compounds, metal films, and other suitable absorbing materials. Examples of suitable radiation absorbers includes carbon black, metal oxides, and metal sulfides. One example of a suitable LTHC layer can include a pigment, such as carbon black, and a binder, such as an organic polymer. Another suitable LTHC layer includes metal or metal/metal oxide formed as a thin film, for example, black aluminum (i.e., a partially oxidized aluminum having a black visual appearance). Metallic and metal compound films may be formed by techniques, such as, for example, sputtering and evaporative deposition. Particulate coatings may be formed using a binder and any suitable dry or wet coating techniques. LTHC layers can also be formed by combining two or more LTHC layers containing similar or dissimilar materials. For example, an LTHC layer can be formed by vapor depositing a thin layer of black aluminum over a coating that contains carbon black disposed in a binder.

Dyes suitable for use as radiation absorbers in a LTHC layer may be present in particulate form, dissolved in a binder material, or at least partially dispersed in a binder material. When dispersed particulate radiation absorbers are used, the particle size can be, at least in some instances, about 10 µm or less, and may be about 1 µm or less. Suitable dyes include those dyes that absorb in the IR region of the spectrum. For example, IR absorbers marketed by Glendale Protective Technologies, Inc., Lakeland, Fla., under the designation CYASORB IR-99, IR-126 and IR-165 may be used. A specific dye may be chosen based on factors such as, solubility in, and compatibility with, a specific binder and/or coating solvent, as well as the wavelength range of absorption.

Pigmentary materials may also be used in the LTHC layer as radiation absorbers. Examples of suitable pigments include carbon black and graphite, as well as phthalocyanines, nickel dithiolenes, and other pigments described in U.S. Pat. Nos. 5,166,024 and 5,351,617. Additionally, black azo pigments based on copper or chromium complexes of, for example, pyrazolone yellow, dianisidine red, and nickel azo yellow can be useful. Inorganic pigments can also be used, including, for example, oxides and sulfides of metals such as aluminum, bismuth, tin, indium, zinc, titanium, chromium, molybdenum, tungsten, cobalt, iridium, nickel, palladium, platinum, copper, silver, gold, zirconium, iron, lead, and tellurium. Metal borides, carbides, nitrides, carbonitrides, bronze-structured oxides, and oxides structurally related to the bronze family (e.g., $WO_{2.9}$) may also be used.

Metal radiation absorbers may be used, either in the form of particles, as described for instance in U.S. Pat. No. 4,252,671, or as films, as disclosed in U.S. Pat. No. 5,256,506. Suitable metals include, for example, aluminum, bismuth, tin, indium, tellurium and zinc.

Suitable binders for use in the LTHC layer include film-forming polymers, such as, for example, phenolic resins (e.g., novolak and resole resins), polyvinyl butyral resins, polyvinyl acetates, polyvinyl acetals, polyvinylidene chlorides, polyacrylates, cellulosic ethers and esters, nitrocelluloses, and polycarbonates. Suitable binders may include monomers, oligomers, or polymers that have been, or can be, polymerized or crosslinked. Additives such as photoinitiators may also be included to facilitate crosslinking of the LTHC binder. In some embodiments, the binder is primarily formed using a coating of crosslinkable monomers and/or oligomers with optional polymer.

The inclusion of a thermoplastic resin (e.g., polymer) may improve, in at least some instances, the performance (e.g., transfer properties and/or coatability) of the LTHC layer. It is thought that a thermoplastic resin may improve the adhesion of the LTHC layer to the donor substrate. In one embodiment, the binder includes 25 to 50 wt. % (excluding the solvent when calculating weight percent) thermoplastic resin, and, preferably, 30 to 45 wt. % thermoplastic resin, although lower amounts of thermoplastic resin may be used (e.g., 1 to 15 wt. %). The thermoplastic resin is typically chosen to be compatible (i.e., form a one-phase combination) with the other materials of the binder. In at least some embodiments, a thermoplastic resin that has a solubility parameter in the range of 9 to 13 $(cal/cm^3)^{1/2}$, preferably, 9.5 to 12 $(cal/cm^3)^{1/2}$, is chosen for the binder. Examples of suitable thermoplastic resins include polyacrylics, styrene-acrylic polymers and resins, and polyvinyl butyral.

Conventional coating aids, such as surfactants and dispersing agents, may be added to facilitate the coating process. The LTHC layer may be coated onto the donor substrate using a variety of coating methods known in the art. A polymeric or organic LTHC layer is coated, in at least some instances, to a thickness of 0.05 $\mu$m to 20 $\mu$m, preferably, 0.5 $\mu$m to 10 $\mu$m, and, more preferably, 1 $\mu$m to 7 $\mu$m. An inorganic LTHC layer is coated, in at least some instances, to a thickness in the range of 0.0005 to 10 $\mu$m, and preferably, 0.001 to 1 $\mu$m.

Referring again to FIG. 1, an optional interlayer 118 may be disposed between the LTHC layer 114 and transfer layer 116. The interlayer can be used, for example, to minimize damage and contamination of the transferred portion of the transfer layer and may also reduce distortion in the transferred portion of the transfer layer. The interlayer may also influence the adhesion of the transfer layer to the rest of the thermal transfer donor element. Typically, the interlayer has high thermal resistance. Preferably, the interlayer does not distort or chemically decompose under the imaging conditions, particularly to an extent that renders the transferred image non-functional. The interlayer typically remains in contact with the LTHC layer during the transfer process and is not substantially transferred with the transfer layer.

Suitable interlayers include, for example, polymer films, metal layers (e.g., vapor deposited metal layers), inorganic layers (e.g., sol-gel deposited layers and vapor deposited layers of inorganic oxides (e.g., silica, titania, and other metal oxides)), and organic/inorganic composite layers. Organic materials suitable as interlayer materials include both thermoset and thermoplastic materials. Suitable thermoset materials include resins that may be crosslinked by heat, radiation, or chemical treatment including, but not limited to, crosslinked or crosslinkable polyacrylates, polymethacrylates, polyesters, epoxies, and polyurethanes. The thermoset materials may be coated onto the LTHC layer as, for example, thermoplastic precursors and subsequently crosslinked to form a crosslinked interlayer.

Suitable thermoplastic materials include, for example, polyacrylates, polymethacrylates, polystyrenes, polyurethanes, polysulfones, polyesters, and polyimides. These thermoplastic organic materials may be applied via conventional coating techniques (for example, solvent coating, spray coating, or extrusion coating). Typically, the glass transition temperature ($T_g$) of thermoplastic materials suitable for use in the interlayer is 25° C. or greater, preferably 50° C. or greater, more preferably 100° C. or greater, and, most preferably, 150° C. or greater. In some embodiments, the interlayer includes a thermoplastic material that has a $T_g$ greater than any temperature attained in the transfer layer during imaging. The interlayer may be either transmissive, absorbing, reflective, or some combination thereof, at the imaging radiation wavelength.

Inorganic materials suitable as interlayer materials include, for example, metals, metal oxides, metal sulfides, and inorganic carbon coatings, including those materials that are highly transmissive or reflective at the imaging light wavelength. These materials may be applied to the light-to-heat-conversion layer via conventional techniques (e.g., vacuum sputtering, vacuum evaporation, or plasma jet deposition).

The interlayer may provide a number of benefits. The interlayer may be a barrier against the transfer of material from the light-to-heat conversion layer. It may also modulate the temperature attained in the transfer layer so that thermally unstable materials can be transferred. For example, the interlayer can act as a thermal diffuser to control the temperature at the interface between the interlayer and the transfer layer relative to the temperature attained in the LTHC layer. This may improve the quality (i.e., surface roughness, edge roughness, etc.) of the transferred layer. The presence of an interlayer may also result in improved plastic memory in the transferred material.

The interlayer may contain additives, including, for example, photoinitiators, surfactants, pigments, plasticizers, and coating aids. The thickness of the interlayer may depend on factors such as, for example, the material of the interlayer, the material and properties of the LTHC layer, the material and properties of the transfer layer, the wavelength of the imaging radiation, and the duration of exposure of the thermal transfer element to imaging radiation. For polymer interlayers, the thickness of the interlayer typically is in the range of 0.05 µm to 10 µm. For inorganic interlayers (e.g., metal or metal compound interlayers), the thickness of the interlayer typically is in the range of 0.005 µm to 10 µm.

Referring again to FIG. 1, a thermal transfer layer 116 is included in thermal mass transfer donor elements of the present invention. Transfer layer 116 can include any suitable material or materials, disposed in one or more layers with or without a binder, that can be selectively transferred as a unit or in portions by any suitable transfer mechanism when the donor element is exposed to direct heating or to imaging radiation that can be absorbed by the LTHC layer and converted into heat.

Examples of transfer layers that can be selectively patterned from thermal mass transfer donor elements include colorants (e.g., pigments and/or dyes dispersed in a binder), polarizers, liquid crystal materials, particles (e.g., spacers for liquid crystal displays, magnetic particles, insulating particles, conductive particles, and the like, typically dispersed in a binder), emissive materials (e.g., phosphors, organic electroluminescent materials, etc.), hydrophobic materials (e.g., partition banks for ink jet receptors), hydrophilic materials, multilayer stacks (e.g., multilayer device constructions such as organic electroluminescent devices), microstructured or nanostructured layers, photoresist, metals, polymers, adhesives, binders, enzymes and other bio-materials, and other suitable materials or combination of materials. These and other transfer layers are disclosed in the following documents: U.S. Pat. Nos. 6,114,088; 5,998,085; 5,725,989; 5,710,097; 5,693,446; 5,691,098; 5,685,939; and 5,521,035; International Publication Nos. WO 97/15173, WO 99/46961, and WO 00/41893.

Particularly well suited transfer layers include materials that are useful in making electronic devices and displays. Thermal mass transfer according to the present invention can be performed to pattern one or more materials on a receptor with high precision and accuracy using fewer processing steps than for photolithography-based patterning techniques, and for materials that are not well-suited for photolithographic patterning (e.g., light emitting polymers), and thus can be especially useful in applications such as display manufacture. For example, transfer layers can be made so that, upon thermal transfer to a receptor, the transferred materials form color filters, black matrix, spacers, barriers, partitions, polarizers, retardation layers, wave plates, organic conductors or semi-conductors, inorganic conductors or semi-conductors, organic electroluminescent layers, phosphor layers, OLEDs, organic transistors such as OFETs, and other such elements, devices, or portions thereof that can be useful in displays, alone or in combination with other elements that may or may not be patterned in a like manner.

In particularly suited embodiments, the transfer layer can include one or more materials useful in emissive displays such as OLED displays. For example, the transfer layer can include a light emitting polymer, an organic small molecule light emitter, an organic charge transport material, as well as other organic conductive or semiconductive materials. Examples of classes of light emitting polymers (LEPs) include poly(phenylenevinylene)s (PPVs), poly-para-phenylenes (PPPs), polyfluorenes (PFs), co-polymers thereof, and blends containing these LEPs or co-polymers. Other examples of light emitting organics include organic small molecule emitters, molecularly doped LEPs, light emitting organics dispersed with fluorescent dyes, and the like. Other types of polymer-based emissive materials include small molecule light emitters dispersed in a polymer matrix. For example, poly(9-vinylcarbazole), commonly known as PVK, PVCz, or polyvinylcarbazole, is frequently used as a polymeric matrix for dispersing small molecules for hybrid OLEDs. Thermal transfer of materials from donor sheets to receptors for emissive display and device applications is disclosed in U.S. Pat. Nos. 6,114,088 and 5,998,085, and in International Publication 00/41893.

In at least some instances, an OLED includes a thin layer, or layers, of one or more suitable organic materials sandwiched between a cathode and an anode. Electrons are injected into the organic layer(s) from the cathode and holes are injected into the organic layer(s) from the anode. As the injected charges migrate towards the oppositely charged electrodes, they may recombine to form electron-hole pairs which are typically referred to as excitons. These excitons, or excited state species, may emit energy in the form of light as they decay back to a ground state (see, for example, T. Tsutsui, *MRS Bulletin*, 22, pp. 39–45 (1997)). Materials useful in OLEDs are disclosed by J. L. Segura, "The Chemistry of Electroluminescent Organic Materials", *Acta Polym.*, 49, pp. 319–344 (1998) and by A. Kraft et al., "Electroluminescent Conjugated Polymers—Seeing Polymers in a New Light", *Angew. Chem. Int. Ed.*, 37, pp. 402–428 (1998).

Illustrative examples of OLED constructions include molecularly dispersed polymer devices where charge carrying and/or emitting species are dispersed in a polymer matrix (see J. Kido "Organic Electroluminescent devices Based on Polymeric Materials", *Trends in Polymer Science*, 2, pp. 350–355 (1994)), conjugated polymer devices where layers of polymers such as polyphenylene vinylene act as the charge carrying and emitting species (see J. J. M. Halls et al., *Thin Solid Films*, 276, pp. 13–20 (1996)), vapor deposited small molecule heterostructure devices (see U.S. Pat. No. 5,061,569 and C. H. Chen et al., "Recent Developments in Molecular Organic Electroluminescent Materials", *Macromolecular Symposia*, 125, pp. 1–48 (1997)), light emitting electrochemical cells (see Q. Pei et al., *J. Amer. Chem. Soc.*, 118, pp. 3922–3929 (1996)), and vertically stacked organic light-emitting diodes capable of emitting light of multiple wavelengths (see U.S. Pat. No. 5,707,745 and Z. Shen et al., *Science*, 276, pp. 2009–2011 (1997)).

Referring to FIG. 1, the donor element 100 can also include an optional transfer assist layer (not shown), most typically provided as a layer of an adhesive or an adhesion promoter coated on the transfer layer 116 as the outermost layer of the donor element 116. Such an optional transfer assist layer can be provided in addition to the active primer layer of the present invention. The transfer assist layer can serve to promote complete transfer of the transfer layer, especially during the separation of the donor from the receptor substrate after imaging. Exemplary transfer assist layers include colorless, transparent materials with a slight tack or no tack at room temperature, such as the family of resins sold by ICI Acrylics under the trade designation Elvacite (e.g., Elvacite 2776). The transfer assist layer may also contain a radiation absorber that absorbs light of the same frequency as the imaging laser or light source. Transfer assist layers can also be optionally disposed on the receptor in addition to or instead of those optionally disposed on donor elements.

The receptor substrate may be any item suitable for a particular application including, but not limited to, glass, transparent films, reflective films, metals, semiconductors, various papers, and plastics. For example, receptor substrates may be any type of substrate or display element suitable for display applications. Receptor substrates suitable for use in displays such as liquid crystal displays or emissive displays include rigid or flexible substrates that are substantially transmissive to visible light. Examples of suitable rigid receptors include glass and rigid plastic that are coated or patterned with indium tin oxide and/or are circuitized with low temperature polysilicon (LTPS) or other transistor structures, including organic transistors. Suitable flexible substrates include substantially clear and transmissive polymer films, reflective films, transflective films, polarizing films, multilayer optical films, and the like. Flexible substrates can also be coated or patterned with electrode materials or transistors. Suitable polymer substrates include polyester base (e.g., polyethylene terephthalate, polyethylene naphthalate), polycarbonate resins, polyolefin resins, polyvinyl resins (e.g., polyvinyl chloride, polyvinylidene chloride, polyvinyl acetals, etc.), cellulose ester bases (e.g., cellulose triacetate, cellulose acetate), and other conventional polymeric films used as supports. For making OLEDs on plastic substrates, it is often desirable to include a barrier film or coating on one or both surfaces of the plastic substrate to protect the organic light emitting devices and their electrodes from exposure to undesired levels of water, oxygen, and the like.

Receptor substrates can be pre-patterned with any one or more of electrodes, transistors, capacitors, insulator ribs, spacers, color filters, black matrix, and other elements useful for electronic displays or other devices.

The present invention contemplates, among other things, using an active primer layer disposed between the donor and receptor during thermal transfer operations to facilitate transfer of materials to form electronic devices or portions thereof. The idea of an active primer is to provide a material or materials that can be disposed to improve adhesion and/or other transfer properties (hence the term "primer") without destroying the operability of the electronic device or devices being patterned (hence the term "active").

Figure 2A:
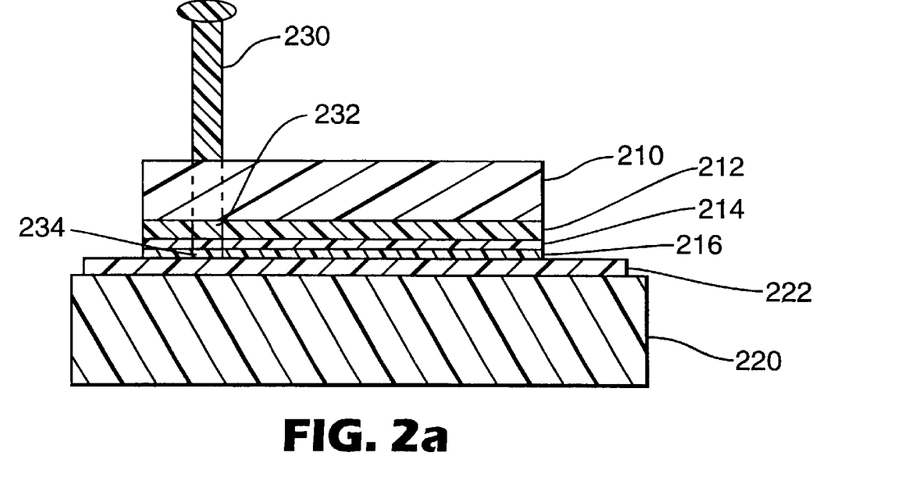
FIG. 2(a) is a schematic cross section of thermal transfer imaging of a donor sheet on a receptor with an active primer of the present invention disposed between the donor and the receptor.
Figure 2B:
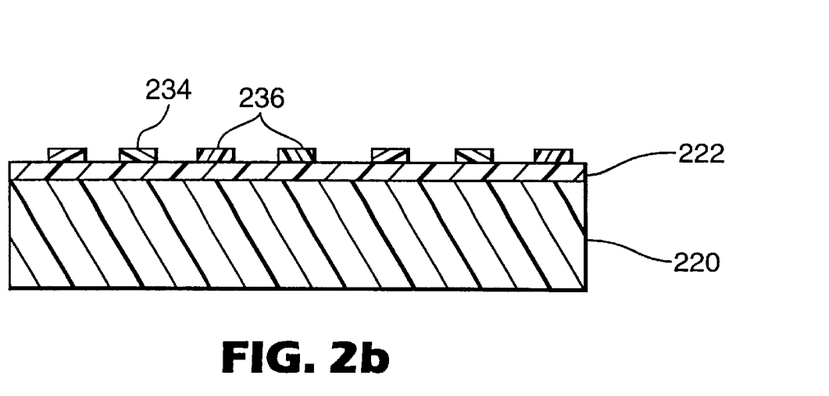
FIG. 2(b) is a schematic cross section of portions of one or more transfer layers thermally transferred onto a receptor having an active primer layer.

To illustrate, FIGS. 2(a) and (b) show selective thermal transfer of a transfer layer 216 onto a receptor 220 where an active primer layer 222 has been disposed between the transfer layer 216 and the receptor 220. Without loss of generality, FIGS. 2(a) and (b) are discussed in terms of transferring organic electroluminescent materials, specifically light emitting polymers, to form OLEDs. It will be recognized, however, that the concepts illustrated can be applied to patterning of other electronic devices or portions thereof. In FIG. 2(a), a laser beam 230 is incident on a donor sheet that includes a substrate 210, an LTHC layer 212, an interlayer 214, and a transfer layer 216. In this case, transfer layer 216 includes a light emitting polymer. The donor is in contact with active primer layer 222 which is disposed on receptor 220. In practice, the active primer layer can be coated onto the transfer layer of the donor sheet, onto the receptor, or both. Also, the active primer layer can be coated to form a single continuous layer on the donor or receptor, or the active primer layer can be patterned on the donor or the receptor. An active primer layer can be patterned by any suitable technique including photolithography, screen printing, selective thermal transfer, deposition through a mask, and the like. When using a patterned active primer layer, it may be desirable to pattern the active primer directly onto the receptor only in those areas where the transfer layer is to be selectively thermally transferred.

When thermally transferring different types on materials onto receptors patterned with active primers of the present invention, it may be desirable to select and pattern different active primers for each different type of material being transferred. For example, when making a full color OLED display, red-emissive, blue-emissive, and green-emissive organic materials can be patterned in adjacent stripes on a receptor from separate donor elements. The receptor can be pre-patterned with active primer stripes specifically formulated for each of the different emissive materials being transferred. For instance, the binders of the active primers for each emissive material transfer might be the same, but the active material in the active primers might be different and specifically selected for performance of each emissive device being transferred.

Active primer layer 222 includes an active material or materials dispersed in a binder, or matrix, material, or covalently bonded to a polymer or blend of polymers. The active material(s) are active in that their electronic properties are selected to maintain device operability. For example, the active materials can include electronically active molecules, oligomers, or polymers that act as charge transporters, emitters, and/or conductors. Exemplary active materials include organic small molecule materials used as light emitters, dopants, and charge transport or charge injection layer materials in OLEDs. The choice of active material can depend on the device type, device construction, and device materials. The binder material or functionalizable polymer can be selected to improve adhesion between the transfer layer material and the receptor during selective thermal transfer. These materials can include relatively inert (e.g., non-active) polymers such as polymethylmethacrylates (PMMAs) or polystyrenes; conductive polymers such as polyanilines or polythiophenes; and/or conjugated (and often light emitting) polymers such as polyparaphenylene vinylenes (PPVs) or polyfluorenes (PFs).

Illustrative examples of emitter materials that may be useful as active materials in active primers of the present invention include 4,4'-bis(2,2-diphenylethen-1-yl)biphenyl, N,N'-bis(4-(2,2-diphenylethen-1-yl)phenyl-N,N'-bis (phenyl)benzidine, and pentaphenylcyclopentadiene. Illustrative examples of dopants that may be useful as active materials in active primers of the present invention include N,N'-dimethylquinacridone, 4-(dicyanomethylene)-2-methyl-6-(julolidin-4-yl-vinyl)-4H-pyran, and 3-(2-benzothiazolyl)-7-(diethylamino)coumarin. Illustrative examples of charge transport materials that may be useful as active materials in active primers of the present invention include hole transporters such as N,N'-bis(3-methylphenyl)-N,N'-diphenylbenzidine (TPD), 1,1-bis((di-4-toylamino) phenyl)cyclohexane, and N,N'-bis(naphthalen-1-yl)-N,N'-diphenylbenzidine and electron transporters such as 3-(biphenyl-4-yl)-4-phenyl-5-t-butylphenyl-1,2,4-triazole, 2-(4-t-butylphenyl)-5-(4-biphenyl-4-yl)-1,3,4-oxadiazole, and tris(8-hydroxyquinolinato)aluminum.

Examples of polymers with pendant active groups that may be useful as functionalizable polymers for active primers of the present invention include poly(4-(m-tolylphenylamino-4'-(m-tolyl-p-vinylphenylamino) biphenyl), poly(4-vinyltriphenylamine), poly (vinylcarbazole), and their copolymers with monomers such as styrene.

In FIG. 2(a), the laser beam 230 causes an area 232 of the LTHC layer to heat up. The selective heating of the donor effects thermal transfer of a portion 234 of the transfer layer to the receptor 220. Active primer layer 222 can improve adhesion of transfer layer portion 234 to the receptor 220 so that when the donor sheet is removed from the receptor, the transfer layer portion 234 remains on the receptor and adequately matches the intended transfer pattern. As shown in FIG. 2(b), several portions can be transferred from the same or separate donor sheets to form other transferred portions 236 on the same receptor 220. Although not shown in FIG. 2, receptor 220 can include other layers, devices, portions of devices, or other patterns such as transistor arrays, patterned or un-patterned anodes, patterned or un-patterned charge transport materials, patterned or un-patterned insulator ribs, patterned or un-patterned buffer layers, patterned or un-patterned color filters, patterned or un-patterned polarizers, black matrix, electronic bus lines, and the like.

After transfer of the light emitting material(s), other device layers can be deposited and/or patterned. Such other device layers can include charge transport materials, cathode layers, and the like. Insulator ribs can also be patterned after transfer of certain device layers, and before deposition of a common cathode to electrically isolate adjacent devices. Patterning of such other layers can be performed by any suitable method including photolithography, thermal transfer, deposition through a mask, and the like. For OLEDs, it is often desirable to encapsulate the devices by coating the finished devices with one or more layers that form a barrier to water, oxygen, and other elements in the environment to which the patterned devices may be susceptible.

EXAMPLES

The following examples illustrate the use of active primer layers in thermally transferring light emitting polymers to form OLEDs.

Example 1

Preparation of a Receptor With an Active Primer Layer

A receptor substrate having an active primer layer was prepared in the following manner.

An indium tin oxide (ITO) striped substrate was spin coated at 2000 r.p.m. with a buffer solution consisting of poly(3,4-ethylenedioxythiophene)/poly(styrene sulfonic acid) (PEDT/PSS) in de-ionized water (70:30 water to PEDT/PSS, by weight). The PEDT/PSS buffer material was the PEDT/PSS commercially available from Bayer Corporation under the trade designation Baytron P 4083. The PEDT/PSS coated substrate was heated at 110° C. on a hot plate for 5 minutes in air. The PEDT/PSS coating served as a hole injecting buffer layer in the patterned OLEDs (see Example 4). An active primer layer was then coated over the PEDT/PSS coating. The active primer layer was a 1:1 dispersion of bis(3-methylphenyl)N,N' dimethylbenzidine (TPD) in polystyrene. The TPD was obtained from Aldrich Chemical Company, Milwaukee, Wis. The polystyrene used had a 50,000 molecular weight and was obtained from Polysciences, Warrington, Pa. The active primer was spin coated onto the PEDT/PSS layer out of a 1.5% weight-to-volume toluene solution.

Example 2

Preparation of Donor Sheet

A thermal transfer donor sheet having a light emitting polymer transfer layer was prepared in the following manner.

An LTHC solution, given in Table I, was coated onto a 0.1 mm thick polyethylene terapthalate (PET) film substrate. Coating was performed using a Yasui Seiki Lab Coater, Model CAG-150, using a microgravure roll with 150 helical cells per lineal inch. The LTHC coating was in-line dried at 80° C. and cured under ultraviolet (UV) radiation.

TABLE I

LTHC Coating Solution

| Component | Trade Designation | Parts by Weight |
|---|---|---|
| carbon black pigment | Raven 760 Ultra [1] | 3.88 |
| polyvinyl butyral resin | Butvar B-98 [2] | 0.69 |
| acrylic resin | Joncryl 67 [3] | 2.07 |
| dispersant | Disperbyk 161 [4] | 0.34 |
| surfactant | FC-430 [5] | 0.01 |
| epoxy novolac acrylate | Ebecryl 629 [6] | 13.18 |
| acrylic resin | Elvacite 2669 [7] | 8.79 |
| 2-benzyl-2-(dimethylamino)-1-(4-(morpholinyl) phenyl) butanone | Irgacure 369 [8] | 0.89 |
| 1-hydroxycyclohexyl phenyl ketone | Irgacure 184 [8] | 0.13 |
| 2-butanone | | 43.75 |
| 1,2-propanediol monomethyl ether acetate | | 26.25 |

[1] available from Columbian Chemicals Co., Atlanta, GA
[2] available from Solutia Inc., St. Louis, MO
[3] available from S.C. Johnson & Son, Inc., Racine, WI
[4] available from Byk-Chemie USA, Wallingford, CT
[5] available from Minnesota Mining and Manufacturing Co., St. Paul, MN
[6] available from UCB Radcure Inc., N. Augusta, SC
[7] available from ICI Acrylics Inc., Memphis, TN
[8] available from Ciba-Geigy Corp., Tarrytown, NY Next, an interlayer (formulation given in Table II) was coated onto the cured LTHC layer by a rotogravure coating method using the Yasui Seiki Lab Coater, Model CAG-150, with a microgravure roll having 180 helical cells per lineal inch. This coating was in-line dried at 60° C. and UV cured.

TABLE II

Interlayer Coating Solution

| Component | Parts by Weight |
|---|---|
| SR 351 HP (trimethylolpropane triacrylate ester, available from Sartomer, Exton, PA) | 14.85 |
| Butvar B-98 | 0.93 |
| Joncryl 67 | 2.78 |
| Irgacure 369 | 1.25 |
| Irgacure 184 | 0.19 |
| 2-butanone | 48.00 |
| 1-methoxy-2-propanol | 32.00 |

Next, a PPV light emitting polymer was spin coated out of a 0.5% weight-to-volume toluene solution onto the cured interlayer coating. The PPV was one commercially available from Covion Organic Semiconductors GmbH, Frankfurt, Germany, and identified as COVION PDY 132.

Example 3

Thermal Imaging of PPV onto an Active Primer Receptor

A light emitting polymer was thermally transferred in a pattern onto a receptor having an active primer layer in the following manner.

The donor sheet prepared in Example 2 was brought into contact with the receptor substrate prepared in Example 1. The receptor was held in a recessed vacuum frame while the donor sheet was placed in contact with the receptor and was held in place via application of a vacuum. The transfer layer (PPV light emitting polymer) of the donor was contacting the active primer layer of the receptor. Next, the donor was imaged using two single-mode Nd:YAG lasers. Scanning was performed using a system of linear galvanometers, with the combined laser beams focused onto the image plane using an f-theta scan lens as part of a near-telecentric configuration. The laser energy density was 0.55 J/cm$^2$. The laser spot size, measured at the 1/e$^2$ intensity, was 30 microns by 350 microns. The linear laser spot velocity was adjustable between 10 and 30 meters per second, measured at the image plane. The laser spot was dithered perpendicular to the major displacement direction with about a 100 μm amplitude. The transfer layers were transferred as lines onto the receptor, and the intended width of the lines was about 90 μm.

The PPV transfer layer was transferred in a series of lines that were in overlying registry with the ITO stripes on the receptor substrate. The patterned PPV lines were observed to be uniform and defect free over the entire substrate, which measured several centimeters in each direction.

Example 4

Preparation of an OLED

An OLED was prepared in the following manner.

Insulating ribs were patterned as stripes on top of, and positioned between each of, the PPV lines patterned onto the receptor as prepared in Example 3. The insulating ribs were patterned by laser induced thermal imaging of an insulating, highly filled thermoset polymer formulation from a donor element to the receptor prepared in Example 3. The insulating ribs as transferred were about 1.6 microns high and overlapped the PPV lines by about 10 microns on each side. Next, a 400 Angstrom thick calcium coating was vapor deposited over the insulating ribs and PPV stripes. Next, a 4000 Angstrom thick aluminum coating was vapor deposited over the calcium coating. The calcium/aluminum construction served as a double layer cathode in the OLED. The insulator ribs maintain electrical isolation between OLED devices. The result was a series of patterned OLEDs on the glass receptor, each OLED including an ITO anode, a PEDT/PSS buffer layer, an active primer layer that functioned as a hole transport layer and transfer assist layer, a light emitting polymer layer, and a common double layer cathode isolated by insulator ribs positioned between the OLEDs. Upon application of a bias voltage across the anode and cathode, bright electroluminescence was observed from each of the patterned OLEDs.

The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the instant specification.

Each of the patents, patent documents, and publications cited above is hereby incorporated into this document as if reproduced in full.

What is claimed is:

1. A receptor for receiving at least a portion of a transfer layer of a donor element by selective thermal transfer, the receptor comprising;

a receptor substrate;

an active primer comprising light-emitting material disposed on the receptor substrate;

a plurality of electrodes disposed between the receptor substrate and the active primer: and a transfer assist layer disposed on the active primer.

2. The receptor of claim 1, further comprising a buffer layer diposed between the plurality of electrodes and the active primer.

3. The receptor of claim 1 wherein the plurality of electrodes are a plurality of anodes and the active primer comprises light-emitting hole transport material.

4. The receptor of claim 3, wherein the active primer further comprises a binder within which the light-emitting hole transport material is dispersed.

5. The receptor of claim 1, wherein the transfer assist layer comprises radiation absorbers.

6. The receptor of claim 1 wherein the active primer comprises light-emitting hole transport material.

7. A receptor for receiving at least a portion of a transfer layer of a donor element by selective thermal transfer, the receptor comprising:

a receptor substrate;

an active primer comprising hole transport material disposed on the receptor substrate;

a plurality of electrodes disposed between the receptor substrate and the active primer; and a transfer assist layer disposed on the active primer.

8. The receptor of claim 7, further comprising a buffer layer disposed between the plurality of electrodes and the active primer.

9. The receptor of claim 7, wherein the active primer further comprises a binder within which the hole transport material is dispersed.

10. The receptor of claim 7, wherein the transfer assist layer comprises radiation absorbers.

* * * * *